United States Patent
Chen

(10) Patent No.: US 7,088,584 B2
(45) Date of Patent: Aug. 8, 2006

(54) AIR GUIDING DEVICE FOR ELECTRONIC COMPONENTS

(75) Inventor: Yun Lung Chen, Tu-chen (TW)

(73) Assignees: Hong Fu Jin Precision Ind (Shenzhen) Co., Ltd., Shenzhen (CN); Hon Hai Precision Ind. Co., Ltd., Tu-Cheng (TW)

(*) Notice: Subject to any disclaimer, the term of this patent is extended or adjusted under 35 U.S.C. 154(b) by 205 days.

(21) Appl. No.: 10/867,991

(22) Filed: Jun. 14, 2004

(65) Prior Publication Data

US 2004/0252459 A1 Dec. 16, 2004

(30) Foreign Application Priority Data

Jun. 13, 2003 (TW) .............................. 92210867 U

(51) Int. Cl.
*H05K 7/20* (2006.01)

(52) U.S. Cl. ....................... 361/695; 454/184
(58) Field of Classification Search ................ 361/687, 361/694–695; 454/184
See application file for complete search history.

(56) References Cited

U.S. PATENT DOCUMENTS

| | | | | |
|---|---|---|---|---|
| 5,917,697 A * | 6/1999 | Wang | .......................... | 361/695 |
| 6,145,586 A * | 11/2000 | Lo | ............................. | 165/80.3 |
| 6,148,907 A * | 11/2000 | Cheng | ........................ | 165/121 |
| 6,174,231 B1 * | 1/2001 | Bodin | ........................ | 454/184 |
| 6,690,577 B1 * | 2/2004 | Chen | .......................... | 361/695 |

FOREIGN PATENT DOCUMENTS

| TW | 288627 | 10/1996 |
|---|---|---|
| TW | 352172 | 2/1999 |

\* cited by examiner

*Primary Examiner*—Gregory D Thompson
(74) *Attorney, Agent, or Firm*—Wei Te Chung

(57) ABSTRACT

An air guiding device for dissipating heat generated by an electronic component in an enclosure includes a duct (30), a guide sleeve (20) slidably attached to the duct, interengaging means for attaching the guide sleeve to the duct and a filter (40) accommodated in the duct. The duct defines a recess (38) therein. The filter is deformably and removably received in the recess. The means includes a plurality of grooves (36) defined in one of the duct and the guide sleeve and a plurality of protrusions (28) formed on the other of the duct and the guide sleeve. The protrusions are engaged in selected grooves so that a length of the guide sleeve with respect to the duct can be adjusted.

20 Claims, 4 Drawing Sheets

AIR GUIDING DEVICE FOR ELECTRONIC COMPONENTS

The present invention is related to U.S. patent application Ser. No. 10/335,326, filed on Dec. 30, 2002, which is currently pending.

BACKGROUND OF THE INVENTION

1. Field of the Invention

The present invention relates generally to air guiding devices, and more particularly to an air guiding device for electronic components in enclosures.

2. Related Art

During operation of a personal computer, heat is generated by the electronic components thereof, especially by electronic packages such as central processing units (CPUs). High-speed processing of signals by a CPU results in a correspondingly high amount of heat being generated. Thus, cooling of CPUs is an important consideration in designing computers. Generally, a heat sink and a fan are used to dissipate heat generated by the CPU. The heat is radiated by the heat sink to ambient air, and heated air is conveyed by the fan to an exterior of the computer enclosure via an air opening. However, heated air often cannot freely flow out of the computer enclosure through the air opening. After the computer has operated for a period of time, a large amount of heated air may accumulate within the computer enclosure. This can lead to instability or even failure of the CPU and other electronic components inside the computer enclosure.

Taiwan patent publication Nos. 288627 and 352172 each disclose an air guiding device for overcoming the above-mentioned problems. Each air guiding device comprises a heat sink module and a ducting means. One end of the ducting means is attached to an air opening of the computer, and an opposite end of the ducting means is attached to the heat sink module by screws or hooking means. Heat is dissipated by the heat sink and blown out of the computer through the ducting means.

However, during assembly and disassembly of the computer, the ducting means must be respectively attached to and removed from the heat sink module. This is unduly cumbersome and time-consuming. In addition, each ducting means is sized such that it can only be used with one type of heat sink module. That is, heat sink modules of varying sizes each require individual ducting means having correspondingly varying sizes. Another drawback of the cited prior art is that when the ducting means becomes dirty, it is cumbersome and time-consuming to disassemble the ducting means in order to clean it.

Thus an improved air guiding device for electronic components which overcomes the above-mentioned problems is desired.

SUMMARY OF THE INVENTION

Accordingly, an object of the present invention is to provide an air guiding device for electronic components which can be easily secured to and removed from an enclosure.

Another object of the present invention is to provide an air guiding device which includes a detachable filter for keeping dust and contaminants from entering an enclosure.

To achieve the above-mentioned objects, an air guiding device of the present invention includes a duct, a guide sleeve slidably attached to the duct, interengaging means for attaching the guide sleeve to the duct and a filter accommodated in the duct. The duct defines a recess therein. The filter is deformably and removably received in the recess. The means includes a plurality of grooves defined in one of the duct and the guide sleeve and a plurality of protrusions formed on the other of the duct and the guide sleeve. The protrusions are engaged in selected grooves so that a length of the guide sleeve with respect to the duct can be adjusted.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
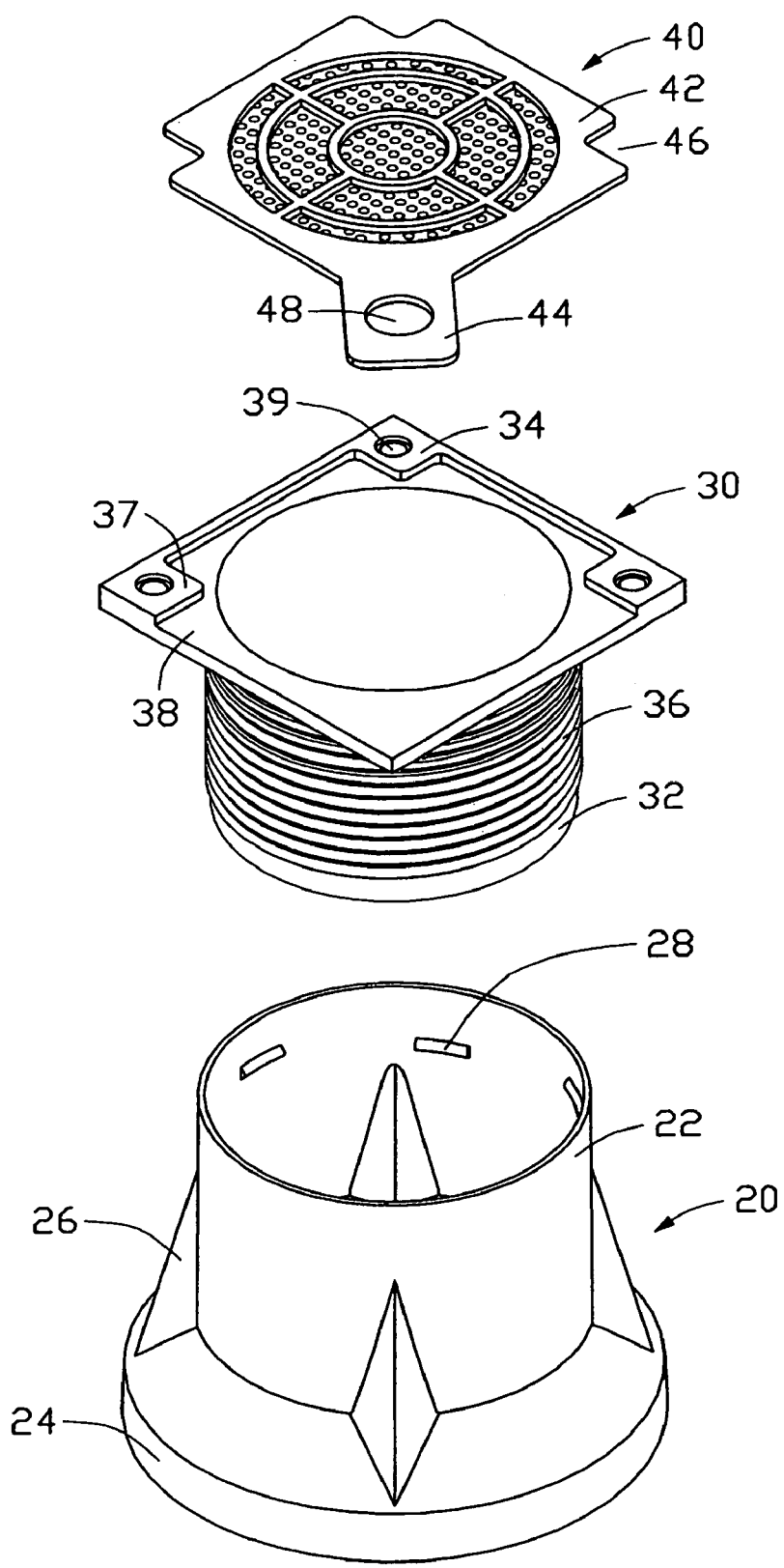
FIG. 1 is an exploded, isometric view of an air guiding device in accordance with a first preferred embodiment of the present invention.

Referring to FIG. 1, an air guiding device in accordance with the first preferred embodiment of the present invention comprises a duct 30, a guide sleeve 20 slidably attached to the duct 30, and a filter 40 removably engaged on the duct 30. The duct 30, guide sleeve 20 and filter 40 are all made of elastic material such as plastic.

The filter 40 comprises a generally rectangular main body 42, and an operating portion 44 extending coplanarly from the main body 42. The main body 42 defines three cutouts 46 in three corners thereof respectively. The operating portion 44 defines a through hole 48 therein for facilitating operation thereof.

The duct 30 comprises a generally rectangular bottom plate 34, and a first tube 32 extending upwardly from the bottom plate 34. The first tube 32 defines a plurality of parallel annular grooves 36 in an outer circumferential surface thereof. A bottom face of the bottom plate 34 defines a recess 38 therein, for accommodating the filter 40. The bottom plate 34 comprises three locking portions 37 in three corners thereof respectively, surrounding the recess 38. The locking portions 37 correspond to the cutouts 46 of the filter 40. Three locking holes 39 are defined in the locking portions 37 respectively. In alternative embodiments of the present invention, the bottom plate 34 may be square, circular, or elliptical, or may have another desired shape.

The guide sleeve 20 comprises a second tube 22, and a cap 24 radially extending from a top end of the second tube 22. A plurality of ribs 26 interconnects outer faces of the second tube 22 and the cap 24, for strengthening the structure of the guide sleeve 20. The second tube 22 comprises a plurality of protrusions 28 formed on an inner circumferential surface thereof, for engaging in selected grooves 36 of the duct 30 and thereby attaching the guide sleeve 20 to the duct 30.

In an alternative embodiment of the present invention, the grooves 36 of the duct 30 and the protrusions 28 of the guide sleeve 20 may be interchanged. That is, the grooves 36 may be defined in the guide sleeve 20, and the protrusions 28 may be formed on the duct 30.

In assembly, the second tube 22 of the guide sleeve 20 is vertically aligned with the first tube 32 of the duct 30. The second tube 22 is pushed toward the first tube 32 so that the first tube 32 slides into the second tube 22. Because the guide sleeve 20 and the duct 30 are made of elastic material, the protrusions 28 of the guide sleeve 20 can elastically ride over the outer circumferential surface of the first tube 32 of the duct 30 and engage in selected grooves 36 thereof. Thus the guide sleeve 20 is slidably attached to the duct 30. A height of the guide sleeve 20 with respect to the duct 30 can be adjusted by engaging the protrusions 28 in different selected grooves 36. The locking portions 37 of the duct 30 are fittingly engaged in the cutouts 46 of the filter 40, thereby attaching the filter 40 in the recess 38 of the bottom plate 34 of the duct 30.

Figure 2:
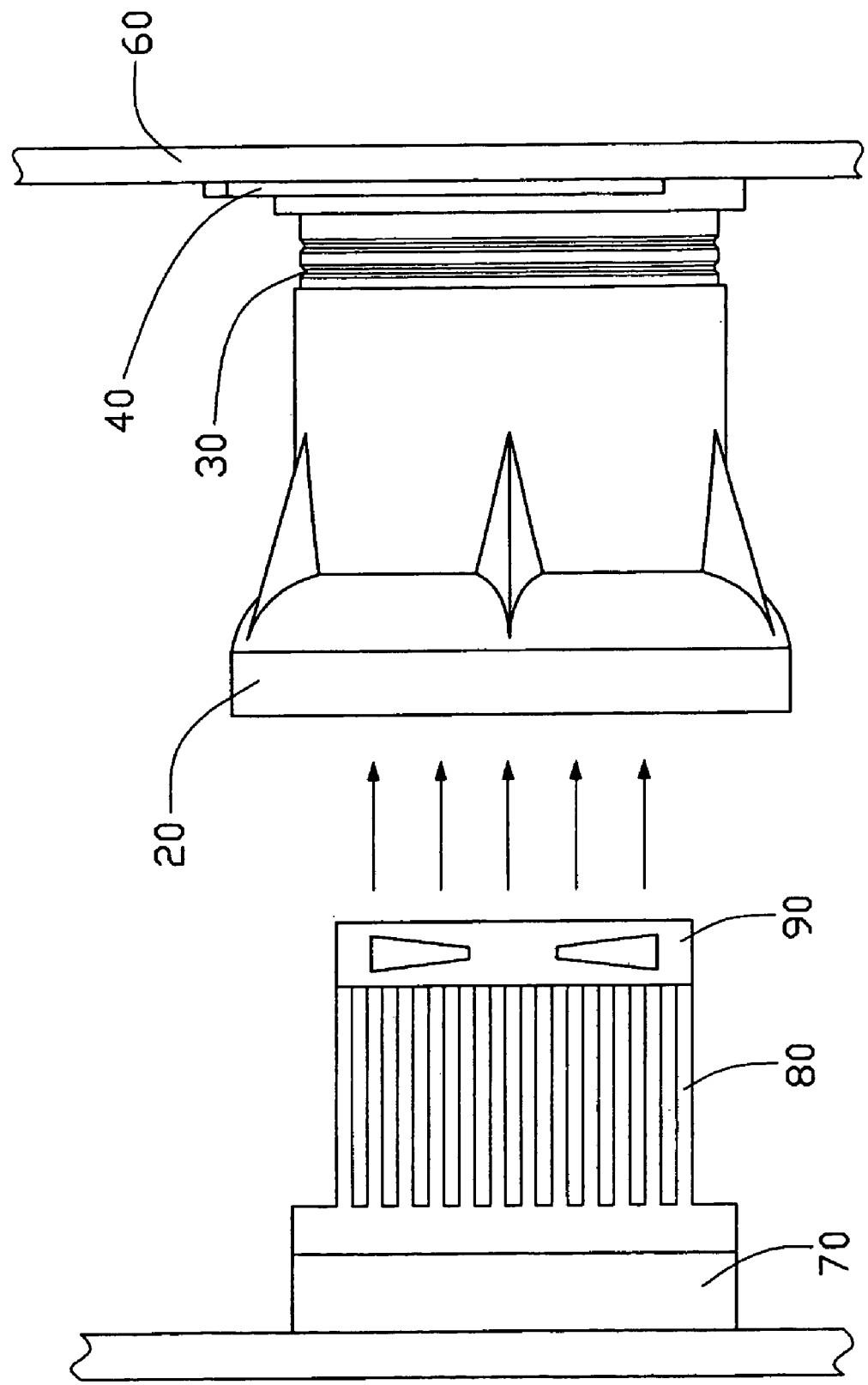
FIG. 2 is a side elevation view of the air guiding device of FIG. 1 fully assembled and attached to a board of a computer enclosure, and showing a CPU, a heat sink and a fan operating in cooperation with the air guiding device.
Figure 3:
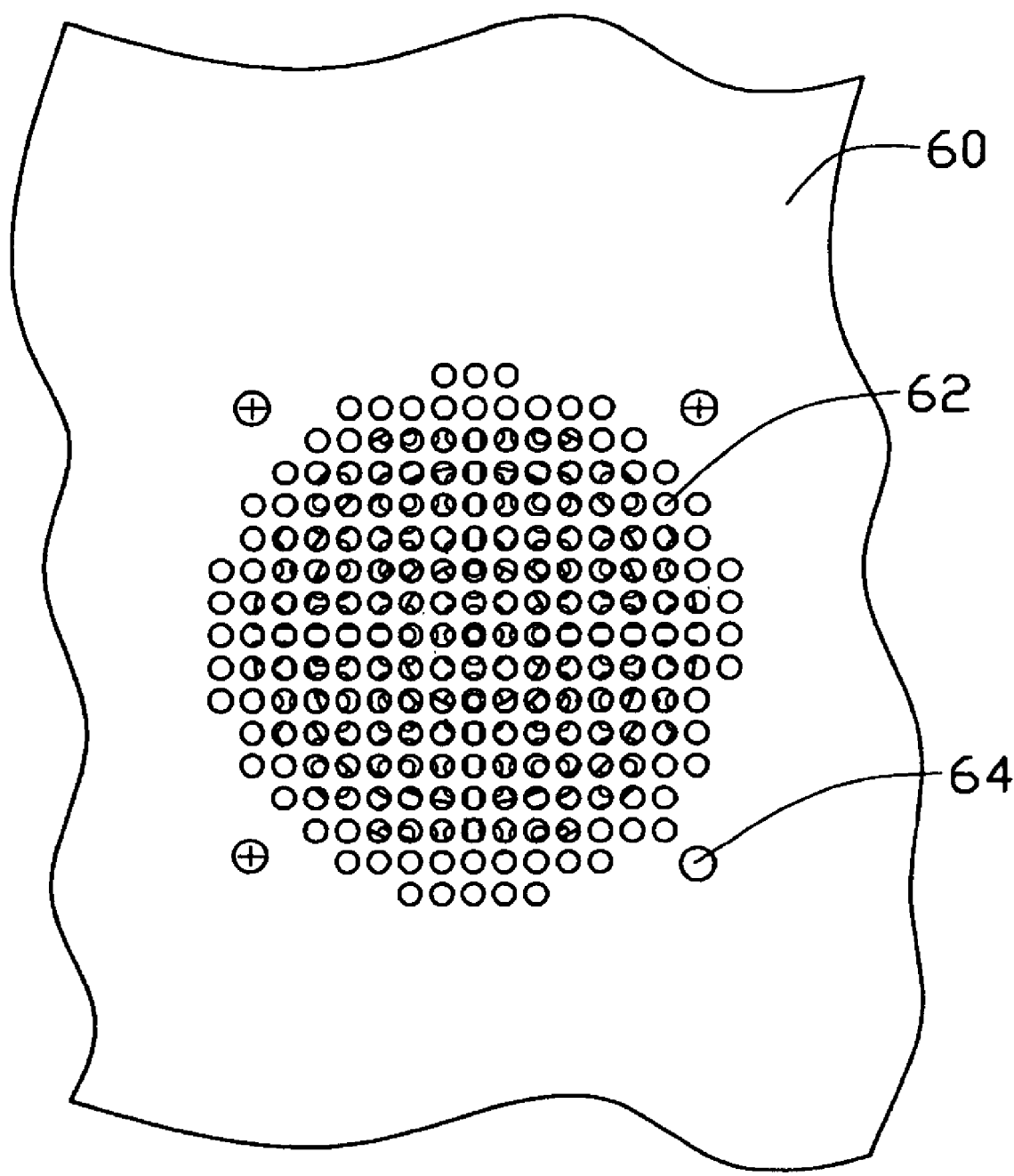
FIG. 3 is a right side plan view of FIG. 2.

Referring to FIGS. 2–3, a heat sink 80 is attached to a CPU 70, and a fan 90 is attached to the heat sink 80. A side board 60 of a computer enclosure is arranged opposite from the fan 90. A plurality of air vents 62 is defined in the side board 60. A plurality of through holes 64 is defined around the air vents 62, corresponding to the locking holes 39 of the duct 30. A plurality of screws (not shown) extends through the through holes of the side board 60 and the locking holes 39 of the duct 30, thereby securing the air guiding device to the side board 60. Heated air is driven through the guide sleeve 20 and the duct 20 by the fan 90 and dissipated to an outside of the side board 60 via the air vents 62. The filter 40 is sandwiched between the bottom plate 34 of the duct 30 and the side board 60. The filter 40 can effectively keep dust and contaminants at the outside of the side board 60 from entering the air vents 62 when the fan 90 is not in operation. When the filter 40 needs to be cleaned after a period of time, it can be deformably slid out from the recess 38 of the bottom plate 34 of the duct 30 without having to unscrew the duct 30 from the side board 60. When the filter 40 is cleaned, it can be deformably slid back into the recess 38 and secured therein.

Figure 4:
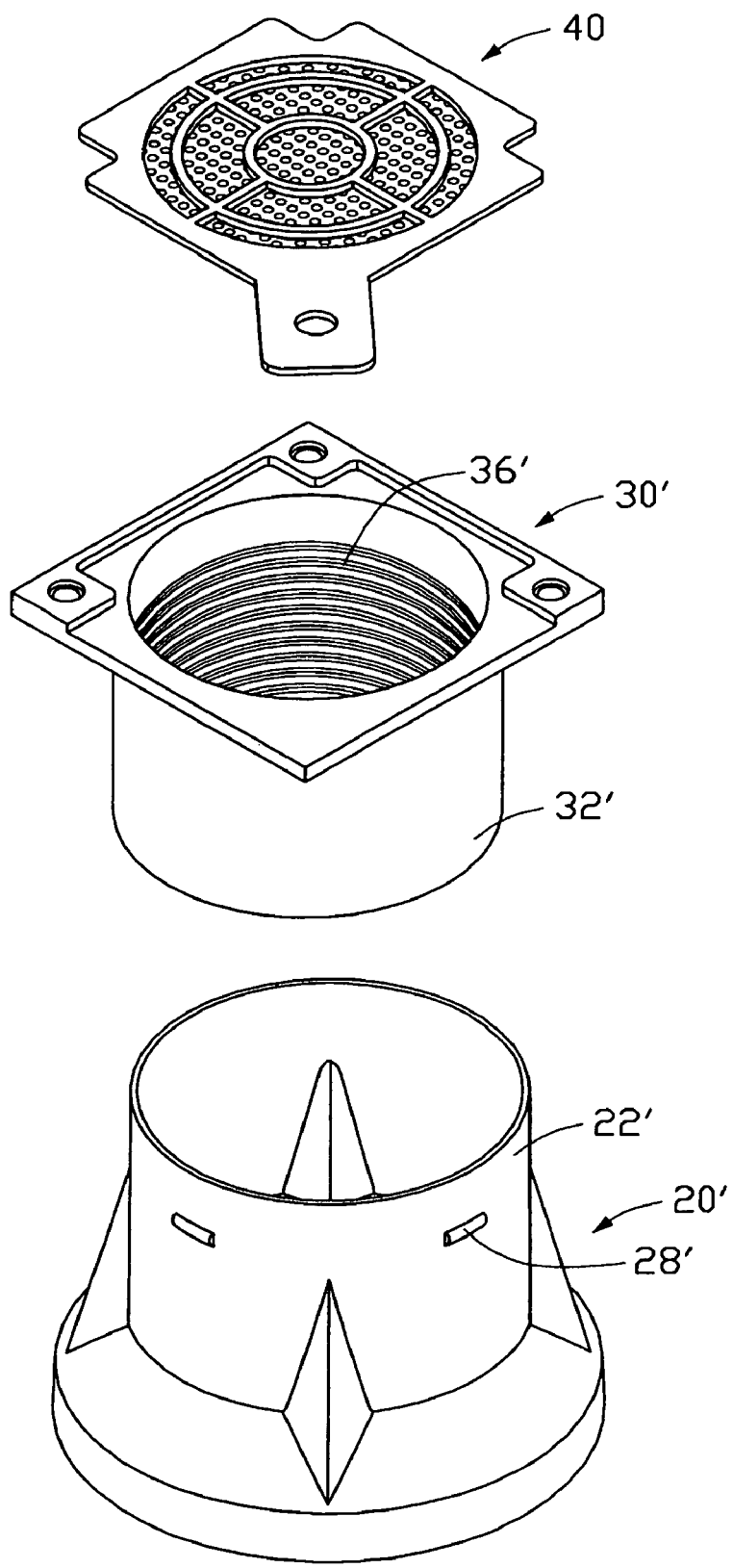
FIG. 4 is an exploded, isometric view of an air guide device in accordance with a second preferred embodiment of the present invention.

FIG. 4 shows an air guiding device in accordance with the second preferred embodiment of the present invention. The air guiding device comprises a duct 30', a guide sleeve 20' slidably attached to the duct 30', and a filter 40 engaged on the duct 30'. The duct 30', guide sleeve 20' and filter 40 are all made of elastic material such as plastic. The filter 40 can be deformably slid out from and slid back into the duct 30'. The duct 30' is similar to the duct 30 of the first preferred embodiment. However, the duct 30' comprises a first tube 32' which defines a plurality of parallel annular grooves 36' in an inner circumferential surface thereof. The guide sleeve 20' is similar to the guide sleeve 20 of the first preferred embodiment. However, the guide sleeve 20' comprises a second tube 22'. The second tube 22' comprises a plurality of protrusions 28' formed on an outer circumferential surface thereof, for engaging in selected grooves 36' of the duct 30' and thereby attaching the guide sleeve 20' to the duct 30'. Assembly of the air guiding device of the second preferred embodiment is substantially the same as that of the first preferred embodiment.

It is understood that the invention may be embodied in other forms without departing from the spirit thereof. Thus, the present examples and embodiments are to be considered in all respects as illustrative and not restrictive, and the invention is not to be limited to the details given herein.

The invention claimed is:

1. An air guiding device for dissipating heat generated by an electronic component in an enclosure, the enclosure comprising a board, the air guiding device comprising:
   a duct adapted to be secured to the board;
   a guide sleeve slidably attached to the duct;
   interengaging means for attaching the guide sleeve to the duct, comprising a plurality of grooves defined in one of the duct and the guide sleeve, and a plurality of protrusions formed on the other of the duct and the guide sleeve; and
   a filter sandwiched between the duct and the board;
   wherein the protrusions are engaged in selected grooves so that a length of the guide sleeve with respect to the duct can be adjusted.

2. The air guiding device as claimed in claim 1, wherein the filter comprises a main body and an operating portion extending from the main body.

3. The air guiding device as claimed in claim 2, wherein the duct comprises a bottom plate and a first tube extending from the bottom plate, and the bottom plate defines a recess therein for accommodating the main body of the filter.

4. The air guiding device as claimed in claim 3, wherein the guide sleeve comprises a second tube and a cap radially extending from an end of the second tube, the first tube of the duct being slidable into the second tube.

5. The air guiding device as claimed in claim 3, wherein the guide sleeve comprises a second tube and a cap radially extending from an end of the second tube, the second tube being slidable into the first tube of the duct.

6. The air guiding device as claimed in claim 1, wherein the protrusions of the interengaging means are formed on an inner circumferential surface of the guide sleeve, and the grooves of the interengaging means are defined in an outer circumferential surface of the duct.

7. The air guiding device as claimed in claim 1, wherein the protrusions of the interengaging means are formed on an outer circumferential surface of the guide sleeve, and the grooves of the interengaging means are defined in an inner circumferential surface of the duct.

8. The air guiding device as claimed in claim 3, wherein the main body of the filter defines a plurality of cutouts, the bottom plate of the duct comprises a plurality of locking portions corresponding to the cutouts of the filter, and the locking portions engage in the cutouts to attach the filter in the recess of the duct.

9. The air guiding device as claimed in claim 8, wherein the locking portions of the bottom plate of the duct define a plurality of locking holes therein, and a plurality of fasteners is extendable through the locking holes in order to secure the duct to the board.

10. The air guiding device as claimed in claim 3, wherein the guide sleeve comprises a plurality of ribs interconnecting the second tube and the cap, for strengthening the guide sleeve.

11. An air guiding device for dissipating heat generated by an electronic component in an enclosure, the enclosure defining a plurality of vents, the air guiding device comprising:
   a duct adapted to be secured to the enclosure and aligned with the vents, the duct comprising a bottom plate, the bottom plate defining a recess therein;
   a guide sleeve slidably attached to the duct for guiding heated air blown from a fan that is located above the electronic component to the duct; and
   a filter fittingly and removably accommodated in the recess of the duct and sandwiched between the bottom plate and the enclosure, for keeping dust and contaminants outside the enclosure from entering the air guiding device via the air vents.

12. The air guiding device as claimed in claim 11, wherein the filter comprises a main body and an operating portion extending beyond the bottom plate of the duct for facilitating operation of the filter.

13. The air guiding device as claimed in claim 11, wherein the duct further comprises a first tube extending from the bottom plate, and the first tube defines a plurality of grooves therein.

14. The air guiding device as claimed in claim 13, wherein the guide sleeve comprises a second tube and a cap radially extending from an end of the second tube, and the second tube comprises a plurality of protrusions corresponding to selectable of the grooves of the first tube of the duct.

15. The air guiding device as claimed in claim 14, wherein the protrusions of the second tube of the guide sleeve are formed on an inner circumferential surface thereof, and the grooves of the first tube of the duct are defined in an outer circumferential surface thereof.

16. The air guiding device as claimed in claim 14, wherein the protrusions of the second tube of the guide sleeve are formed on an outer circumferential surface thereof, and the grooves of the first tube of the duct are defined in an inner circumferential surface thereof.

17. The air guiding device as claimed in claim 12, wherein the bottom plate of the duct comprises a plurality of locking portions corresponding to the cutouts of the filter, and the locking portions fittingly engage in the cutouts to secure the filter in the recess of the duct.

18. The air guiding device as claimed in claim 17, wherein the locking portions of the bottom plate of the duct define a plurality of locking holes therein, and a plurality of fasteners is extendable through the locking holes in order to secure the duct to the enclosure.

19. The air guiding device as claimed in claim 14, wherein the guide sleeve comprises a plurality of ribs interconnecting the second tube and the cap, for strengthening the guide sleeve.

20. An air guide device assembly comprising:
   first and second boards arranged opposite to each other;
   a heat generating device mounted on the first board and between said first and second boards;
   a heat sink seated upon the heat generating device;
   a fan seated upon the heat sink;
   a duct mounted to said second board and between said first and second boards under a condition that the second board defines openings corresponding to the duct axially;
   a sleeve mounted to the duct and axially adjustably sliding along said duct to define different axis lengths of the combined duct and sleeve and form the diffrent distances between the distal outer end of the sleeve and the fan accordingly for compliance with different computer enclosures; and
   a filter sandwiched between the second board and the duct, and communicating with the openings of the second board axially.

* * * * *